United States Patent
Tu

(10) Patent No.: US 6,602,427 B1
(45) Date of Patent: Aug. 5, 2003

(54) MICROMACHINED OPTICAL MECHANICAL MODULATOR BASED TRANSMITTER/RECEIVER MODULE

(76) Inventor: Xiang Zheng Tu, 1293 Westwood Street, Redwood City, CA (US) 94061

( * ) Notice: Subject to any disclaimer, the term of this patent is extended or adjusted under 35 U.S.C. 154(b) by 198 days.

(21) Appl. No.: 09/649,425

(22) Filed: Aug. 28, 2000

(51) Int. Cl.[7] .............................. B81B 7/02; G01B 9/02
(52) U.S. Cl. .............................. 216/2; 216/24; 216/51; 216/57; 216/87; 216/99
(58) Field of Search .............................. 216/2, 24, 50, 216/51, 56, 57, 87, 99

(56) References Cited

U.S. PATENT DOCUMENTS

| | | | |
|---|---|---|---|
| 5,408,319 A | * | 4/1995 | Halbout et al. ............. 219/201 |
| 5,589,689 A | * | 12/1996 | Koskinen ................. 250/338.1 |
| 6,147,756 A | * | 11/2000 | Zavracky et al. ........... 356/519 |
| 6,215,577 B1 | * | 4/2001 | Koehl et al. ............... 359/247 |
| 6,271,052 B1 | * | 8/2001 | Miller et al. ............... 438/50 |

* cited by examiner

Primary Examiner—Shrive P. Beck
Assistant Examiner—Allan Olsen
(74) Attorney, Agent, or Firm—Bruce H. Johnsonbaugh

(57) ABSTRACT

A method for fabricating a micromachined optical mechanical modulator based WDM transmitter/receiver module is described. The Fabry-Perot cavity of the mechanical modulator is structured from a three-polysilicon-layer stack formed on the surface of a single crystalline silicon substrate. The polysilicon membrane and its supporting polysilicon beams of the cavity are cut from the top polysilicon layer of the stack and are released by selective etching of their underlying polysilicon. The etched underlying polysilicon layer is heavily doped and then converted into porous polysilicon by anodization in HF solution. The polysilicon membrane and its supporting polysilicon are finally released using a reactive ion etch process to avoid stiction often generated in a wet etch process. A conic hole is formed on the backside of the single crystalline silicon substrate for receiving an optical fiber that can be passively aligned with the Fabry-Perot cavity.

12 Claims, 8 Drawing Sheets

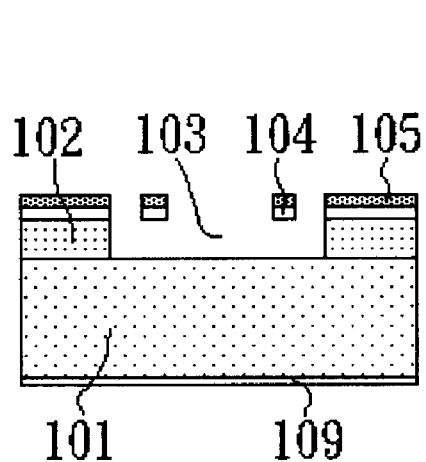
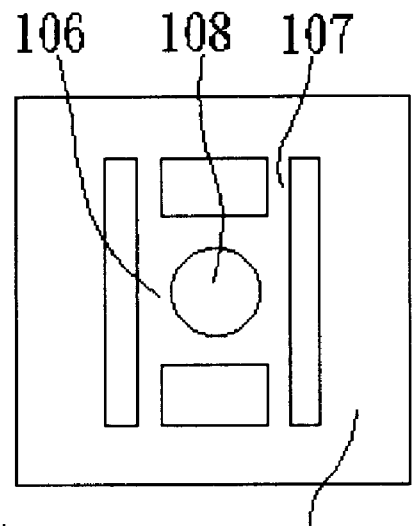
Prior Art
FIG. 1A    FIG. 1B
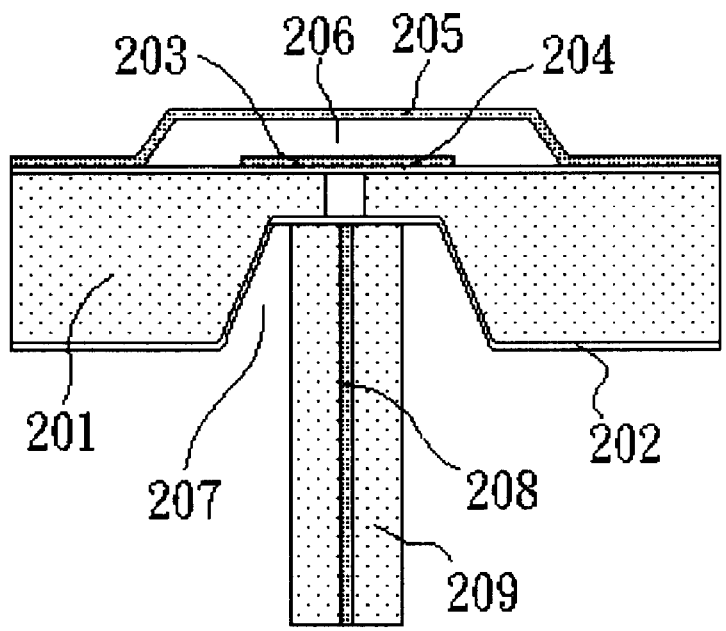
Prior Art
FIG. 2

MICROMACHINED OPTICAL MECHANICAL MODULATOR BASED TRANSMITTER/RECEIVER MODULE

BACKGROUND OF THE INVENTION

This invention is related to a wavelength division multiplexing (WDM) transmitters receiver module, more particularly, is related to a WDM transmitter/receiver module that utilizes a micromachined optical mechanical modulator as its transmitter.

Fiber optic communication, particularly fiber-to-the-home (FTTH), drives the demand for low cost, highly reliable transmitter/receiver modules which fulfill standards of successfully implemented technologies such as WDM. At least two types of WDM transmitter/receiver modules have been developed. One type needs an additional semiconductor laser resident at the home and used as the transmitter for the home user. The laser can be directly modulated up to several G bit/s, but is expensive, temperature-sensitive, and power hungry, driving up system cost and affecting performance. The other type is a ring-back architecture that features a single laser in the system, located at the central office, while the home terminus only requires a micromachined optical mechanical modulator. Data to the home is sent in the conventional way; while the data to the office is produced through modulating the light beam from the central office using the micromachined optical mechanical modulator and then sending it back.

For many applications the data to the office may be much slower than the data to the home, i.e., several M bit/s would be sufficient. Such a slow data can be achieved using micromachined optical mechanical modulators. In addition, the micromachined optical mechanical modulator presents the advantage of low cost and good optical performance including low insertion loss, high contrast and polarization insensitivity.

Research on machined optical modulators goes back several decades. These early mechanical optical modulators are of the phase shifting or scanning mirror type. In recent years micromachined optical mechanical modulators based on the interference effect of Fabry-Perot cavity have gained great attention. Microfabrication technologies allow an entire system of electronics integrated in a silicon chip, a few millimeters in size, which are mass-produced from wafers of single crystalline silicon. The same basic fabrication concept and materials, is now being adopted to make low cost, small size, high performance optical components and systems.

Several micromachined optical mechanical modulators have been reported. FIG. 1A and FIG. 1B show a micromachined optical mechanical modulator consisting of a single crystalline silicon substrate 101, an Aluminum supporting frame 102, an air gap 103, and a silicon nitride membrane 104. The silicon nitride membrane 104 is defined as the area released from the single crystalline silicon substrate 101 and consists of the central plate 106 suspended by thin support beams 107. An opening in the electrode material on the central plate 106 of the device defines an optical window 108. To operate the device a voltage is applied to the device through a top electrode 105 and a bottom electrode 109. When the voltage is zero, the gap 103 between the membrane 104 and the substrate 101 is $m\lambda/4$ (m is odd number) and the reflectivity of the Fabry-Perot cavity comes to maximum. When a voltage is increased so that the membrane 104 is deformed downward to the substrate 101 and the gap 103 is $(m-1)\lambda/4$, the reflectivity of the Fabry-Perot cavity comes to minimum. In this way an incident light beam can be reflected by the Fabry-Perot cavity and the intensity of the reflected light beam can be modulated through the voltage applied to the device.

The Aluminum/silicon nitride structure is convenient but does present some problems. When deposited thickness approaches 1 $\mu$m, the surface of the Aluminum layer can become quite rough and hillocks. Coupled with the surface of the Aluminum layer, the pinhole density of the silicon nitride becomes a greater issue. The existence of pinholes in the silicon nitride or Aluminum hillocks under the silicon nitride can lead to shorting of the electrodes and failure of the device. In addition, as with any micro-machining process, etch selectivity is a concern. This is especially true in forming the Fabry-Perot cavity, since any change in the dimension of the cavity would change the optical properties of the device. Unfortunately, it is impossible to control the lateral dimension of the cavity using an Aluminum layer as the sacrificial material.

In an alternate prior art design, as shown in FIG. 2, the Fabry-Perot cavity consists of a deformable mirror 205, an air gap 206, and a fixed mirror 203 formed on the surface of a single crystalline silicon substrate 201 coated with a silicon dioxide layer 202. The fixed mirror 203 comprises a polysilicon layer formed by low-pressure chemical vapor deposition (LPCVD) and an anti-reflection layer 204. The anti-reflection layer 204 consists of a wet silicon dioxide layer and a LPCVD silicon nitride layer. A 1.6 $\mu$m thick phosphorus-doped oxide (PSG) layer is deposited on the surface of the fixed mirror used as a sacrificial layer. A second polysilicon layer is deposited on the surface of the PSG layer. The air gap 206 is formed using selective etching of the PSG layer. A hole 207 with a slanted wall is formed on the backside of the substrate 201. An optical fiber consisting of grading layer 209 and core 208 is inserted into the hole 207 so that the core 208 is aligned with a small hole under the fixed mirror 203.

There are several problems with this design: (1) it is difficult to make a stress free material, or a low tensile stress material for the use of Fabry-Perot cavity. Actually there is a notable compressive stress existed in the polysilicon membrane that makes the membrane uneven and therefore dramatically affects the performance of the Fabry-Perot cavity; (2) the surface roughness of the polysilicon membrane is up to 140 Å due to the rough surface of the underlying thicker sacrificial PSG layer which results in a higher insertion loss; (3) the applied voltage is up to 70 V due to the thicker sacrificial PSG layer or a wider gap between the two mirrors; (4) the hole for receiving an optical fiber is not precisely aligned with the Fabry-Perot cavity and cannot be used for passive alignment between the Fabry-Perot cavity and the optical fiber; and (5) the Fabry-Perot cavity is out of the plane of the substrate which makes the device easy to break and the production yield difficulty to increase.

It is, therefore, an object of the present invention is to provide a micromachined optical mechanical modulator based transmitter/receiver module, the Fabry-Perot cavity of which is formed by structuring a homo-junction layer stack instead of a hetero-junction layer stack to eliminate any intrinsic stress caused by the mismatch in the thermal conductivity and lattice parameters between the different layers.

Another object of the present invention is to provide a micromachined optical mechanical modulator based transmitter/receiver module, in which the membrane and its supporting beams are finally released by dry etching instead of wet etching to eliminate any stiction caused by the liquid capillary forces occurring during the wet release process.

Still another object of the present invention is to provide a micromachined optical mechanical modulator based transmitter/receiver module, the sacrificial layer of which can be quite thin so that the air gap of the Fabry-Perot cavity formed by removing the sacrificial layer is narrower and therefore the needed operating voltage for changing the distance of the air gap is relatively low.

Still another object of the present invention is to provide a micromachined optical mechanical modulator based transmitter/receiver module, the sacrificial layer of which again can be quite thin, so that the unevenness of the membrane and its supporting beams, which is caused by the rough surface of the thicker sacrificial layer, is relatively low and therefore the insertion loss of the Fabry-Perot cavity is relatively low.

Still another object of the present invention is to provide a micromachined optical mechanical modulator based transmitter/receiver module, the inserting hole of which for incorporating an optical fiber therein can be formed by one-sided processing so that it can be aligned with the central axis of the Fabry-Perot cavity with a high lithographic accuracy.

Still another object of the present invention is to provide a micromachined optical mechanical modulator based transmitter/receiver module, the Fabry-Perot cavity of which has an in-planar configuration so that it can be fabricated using a standard planar semiconductor processing technology and has better mechanical strength leading to a higher production yield.

SUMMARY OF THE INVENTION

To realize the above-mentioned objects and other objects, a new micromachined optical mechanical modulator based transmitter/receiver module is provided in accordance with the present invention. As shown in FIG. 3, the Fabry-Perot cavity of the micromachined optical mechanical modulator comprises a top polysilicon membrane and its supporting flexible polysilicon beams 304, a bottom polysilicon membrane 302, and an air gap 306 sandwiched between the top polysilicon membrane and its supporting beams 304 and the bottom polysilicon membrane 302. The central area of the front surface of the top polysilicon membrane is coated with an anti-reflecting layer 305. On the surrounding area of the central area of the front surface of the top polysilicon membrane and the entire area of the top supporting polysilicon beams are coated with an insulating layer 309 and an electrical layer 310. The back surface of the bottom polysilicon membrane 302 is coated with an anti-reflecting layer 303. An electrical contact 308 is connected to the underlying high doping concentration region of a diffusion silicon layer formed in a single crystalline silicon substrate 301. Two metal stripes 313 and 314 are connected to an outside electronic signal source for operating the Fabry-Perot cavity.

The Fabry-Perot cavity is structured from a three-polysilicon-layer stack 307 formed on the surface of the single crystalline silicon substrate. The polysilicon membrane and its supporting polysilicon beams 304 are cut from the top polysilicon layer and released by etching the underlying middle polysilicon layer. Except as a sacrificial layer for releasing the membrane and its supporting beams 304, the middle polysilicon layer is used: (1) as a supporting layer for suspending the membrane and its supporting beams 304; (2) as an insulating layer for electrically isolating the membrane and its supporting beams 304 from the underlying high doping concentration region of the diffusion silicon layer. The bottom polysilicon layer is used as a buffering layer sandwiched between the top polysilicon layer and the underlying single crystalline silicon substrate. The buffering layer can prevent any mismatch stresses from generating in the top polysilicon layer including the membrane and its supporting beams.

A photodiode 316 is mounted over the Fabry-Perot cavity with its solder bumps 318 secured on the surface of the three-polysilicon-layer stack 307. Under the Fabry-Perot cavity there is a conic hole 315 formed in the single crystalline silicon substrate. A rigid plate 312 with a throughout hole is cemented to the single crystalline silicon substrate 301 by applying an adhesive layer 311. An optical fiber 319 is fixed in the conic hole 315 through the throughout hole of the rigid plate 312. The core 320 of the optical fiber 319 is aligned with the central axis of the Fabry-Perot cavity so that the light beam coming out of the core 320 can be precisely projected onto the optical sensitive area 317 of the photodiode 316.

The selective removal of the middle polysilicon layer is done using a porous polysilicon micromachining technology based on selective formation and etching of porous polysilicon. The middle layer of the three-polysilicon-layer stack 307 has a heavily doped polysilicon region surrounded by un-doped polysilicon. The top polysilicon layer has a plurality of openings partially to expose the underlying heavily doped polysilicon region and is used to form the polysilicon membrane and its supporting polysilicon. The bottom polysilicon layer has a plurality of small heavily doped polysilicon regions partially covering the underlying p-type silicon region of the single crystalline silicon substrate. Anodization in hydrofluoric (HF) solution is performed to turn the heavily doped polysilicon into porous polysilicon, while keeping the un-doped polysilicon unchanged. After removing the porous polysilicon in a week silicon etchant, such as a diluted alkali solution the polysilicon membrane and its supporting polysilicon beams are released from the underlying polysilicon layer.

The conic hole 315 of the single crystalline silicon substrate is formed using a porous single crystalline silicon micromachining technology based on selective formation and etching of porous single crystalline silicon. The conic hole 315 is originally filled with porous single crystalline silicon. The porous single crystalline silicon is formed by anodization of the p-type single crystalline silicon in HF solution. In order to form a p-type single crystalline silicon cone, an n-type single crystalline silicon layer ring is formed by thermal diffusion in the p-type single crystalline silicon substrate. Since the thermal diffusion proceeds in both depth and lateral directions the bounding sidewall of the diffusion layer is slantwise. So the p-type single crystalline silicon region surrounded by the n-type diffusion single crystalline silicon layer ring is shaped in an inverse cone with the top diameter larger than the bottom diameter. The p-type single crystalline silicon cone is designed to have a diameter at the top less than the outer diameter of a single-mode fiber so that the cross-section diameter on the halfway of the p-type single crystalline silicon cone matches the outer diameter of the single-mode fiber.

The three-polysilicon-layer stack 307 is formed on the surface of the single crystalline silicon substrate so that its central point is along the central axis of the p-type single crystalline silicon cone.

The anodization is first carried out to turn the heavily doped polysilicon into porous polysilicon. Then the anodization is continued to turn the p-type single crystalline silicon in the p-type single crystalline silicon cone into porous single crystalline silicon.

The polysilicon membrane and its supporting polysilicon beams of the Fabry-Perot cavity are released by using a two-step process. Removing the formed porous polysilicon is the first step for releasing the polysilicon membrane and its supporting polysilicon beams. At this point the polysilicon membrane and its supporting polysilicon beams are still supported by a plurality of un-doped polysilicon poles. The un-doped polysilicon poles are originally surrounded by heavily doped polysilicon. The heavily doped polysilicon is anodized to form porous polysilicon and then removed by etching, while the un-doped polysilicon poles are left behind. The un-doped polysilicon poles are used to prevent the polysilicon membrane and its supporting beams from sticking onto the surface of the bottom polysilicon layer during the etching of the underlying porous polysilicon layer in a diluted alkali solution. As the second step, the un-doped polysilicon poles are removed by dry etching. After the dry etching the polysilicon membrane and its supporting beams are released completely. During the dry etching process no stiction occurs because there is no liquid reactive agent.

In the anodization process both the surface of the polysilicon membrane and its supporting polysilicon beams and the surface of the un-doped polysilicon poles need to be protected. In the dry etching process the surface of the polysilicon membrane and its supporting polysilicon beams still need to be protected, but the surface of the un-doped polysilicon poles does not need to be protected anymore. To meet these requirements, the protecting layer of the polysilicon membrane and its supporting polysilicon beams are comprised of both silicon nitride and silicon dioxide and the protecting layer of the un-doped polysilicon is comprised of only silicon nitride. An etchant for the dry etching is chosen to have higher etch rates for both silicon nitride and polysilicon, lower etch rate for silicon dioxide, and almost zero etch rate for metals, such as a gold and chrome.

BRIEF DESCRIPTION OF THE DRAWINGS

FIG. 1A and FIG. 1B show a cross sectional view and a top view of a micromachined optical mechanical modulator provided in prior art.

FIG. 2 shows a cross sectional view of another micromachined optical mechanical modulator provided in prior art.

DETAILED DESCRIPTION OF THE INVENTION

A major process flow for fabricating the micromachined optical mechanical modulator based transmitter/receiver modules in accordance with the present invention is illustrated in FIG. 4 to FIG. 14.

Figure 3:
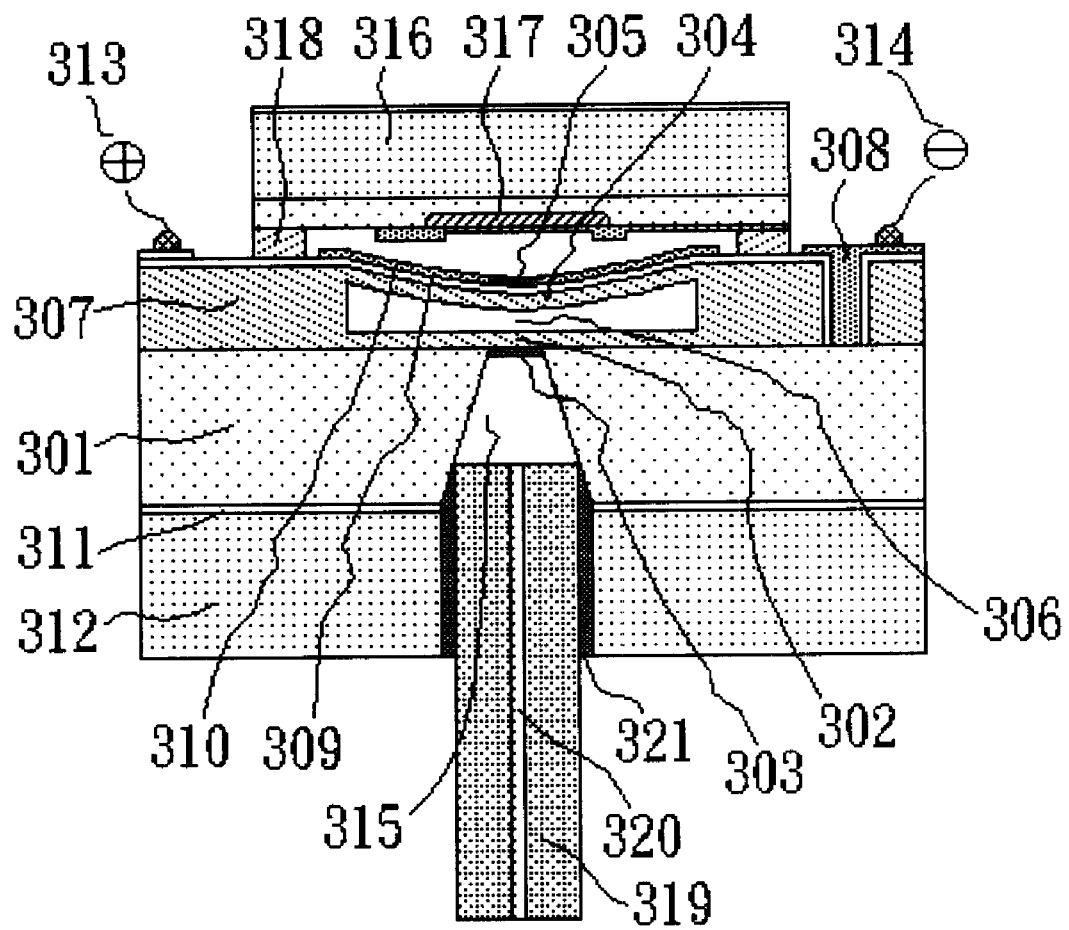
FIG. 3 shows a cross sectional view of a micromachined optical mechanical modulator in accordance with the present invention.
Figure 4:
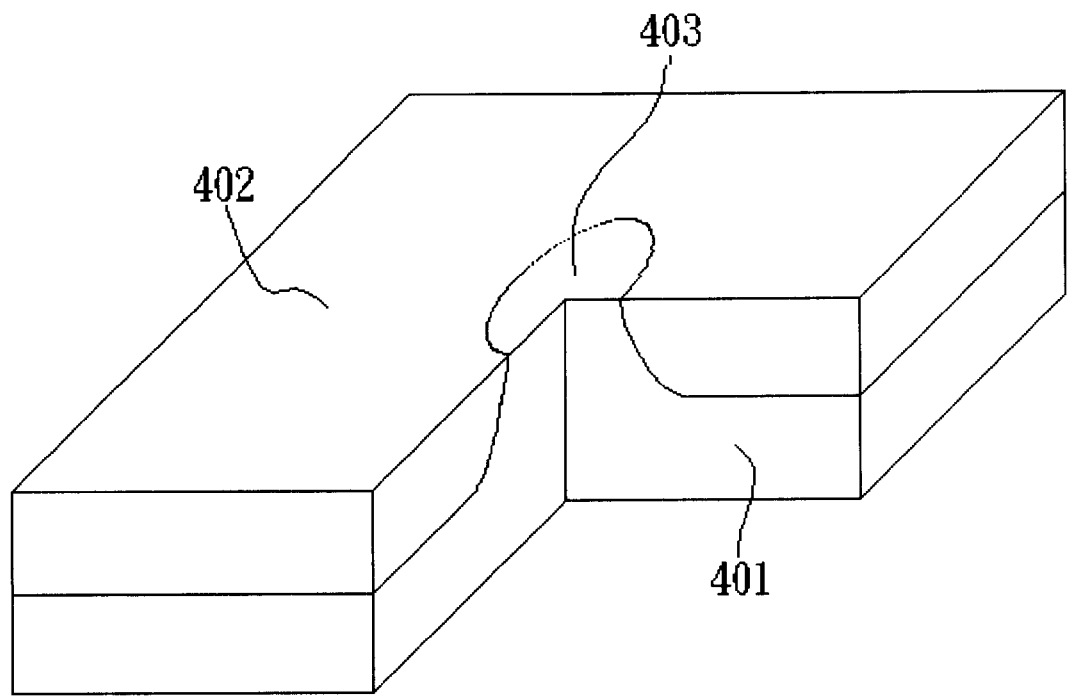
FIG. 4 to FIG. 14 show partially cut-away perspective views of a micromachined optical mechanical modulator at various fabrication steps for a preferable embodiment in accordance with the present invention

Referencing to FIG. 4, the process starts with a lightly doped p-type (100) single crystalline silicon substrate 401. About 1 μm thick silicon dioxide layer is grown on the surface of the single crystalline silicon substrate 401 by thermal oxidization in wet oxygen atmosphere. The silicon dioxide layer is patterned by photolithography and wet etching. About a 20 μm thick n-type diffusion layer 402 is formed in the single crystalline silicon substrate 401 by thermal diffusion using the patterned silicon dioxide layer as a diffusion mask. The diffusion layer 402 forms a ring area that surrounds a central p-type region 403 and has an inner diameter of about 110 μm at the top. Since the diffusion proceeds in both the depth direction and the lateral direction, the central p-type region 403 has a conic shape with a smaller diameter at the top and a larger diameter at the bottom.

Figure 5:
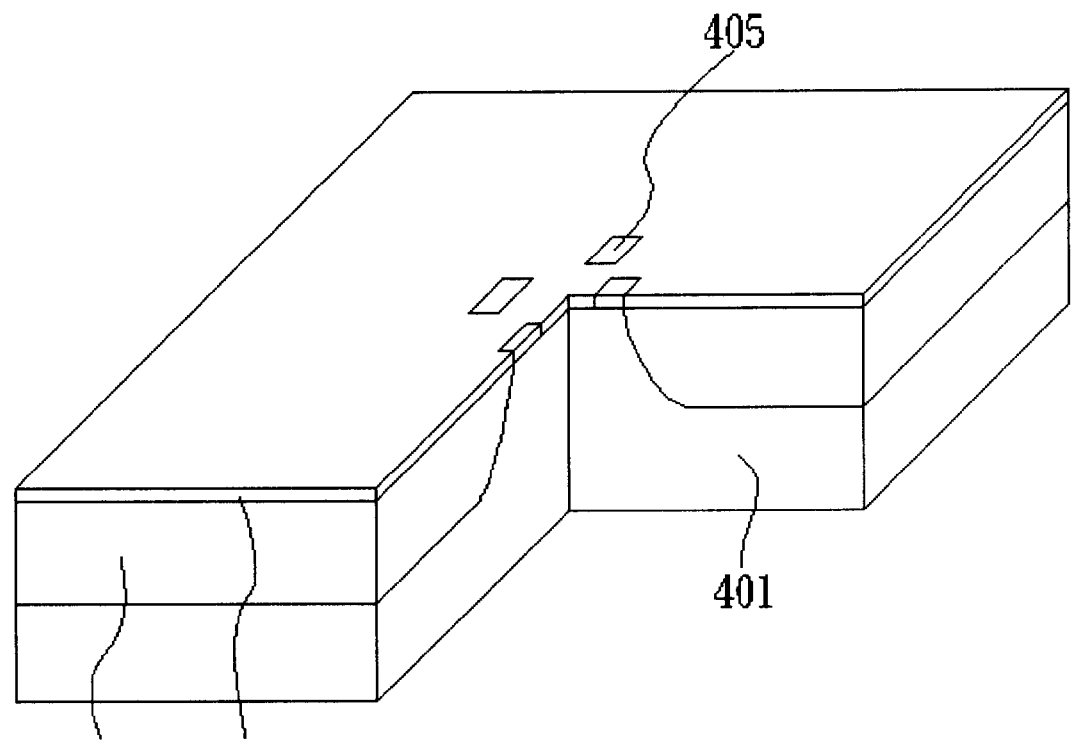

FIG. 5 shows that a bottom polysilicon layer 404 is deposited on the surface of the single crystalline silicon substrate 401 at 650° C. using LPCVD. The thickness of the bottom polysilicon layer 404 is set to be mλ/4, where m is odd number in a general case and 1 in a typical case, λ is the wavelength of an incident light beam. No intensive doping is performed for the bottom polysilicon layer 404. The resistivity of the bottom polysilicon layer 404 is required to be higher than $10^6$ Ω-cm. Then a low temperature oxide (LTO) layer is formed on the surface of the bottom polysilicon layer 404 by LPCVD. Patterning of the LTO layer is performed by photolithography and wet etching. Using the patterned LTO layer as a mask phosphorous ion implantation is carried out with a dose of $1\times10^{15}/cm^2$ and a drive energy of 60 kev. Thermal annealing is followed at 1100° C. for 30 min in dry nitrogen atmosphere to form four small heavily doped regions 405 that are arranged to be symmetrical around the central axis of the underlying p-type single crystalline silicon cone 403.

Figure 6:
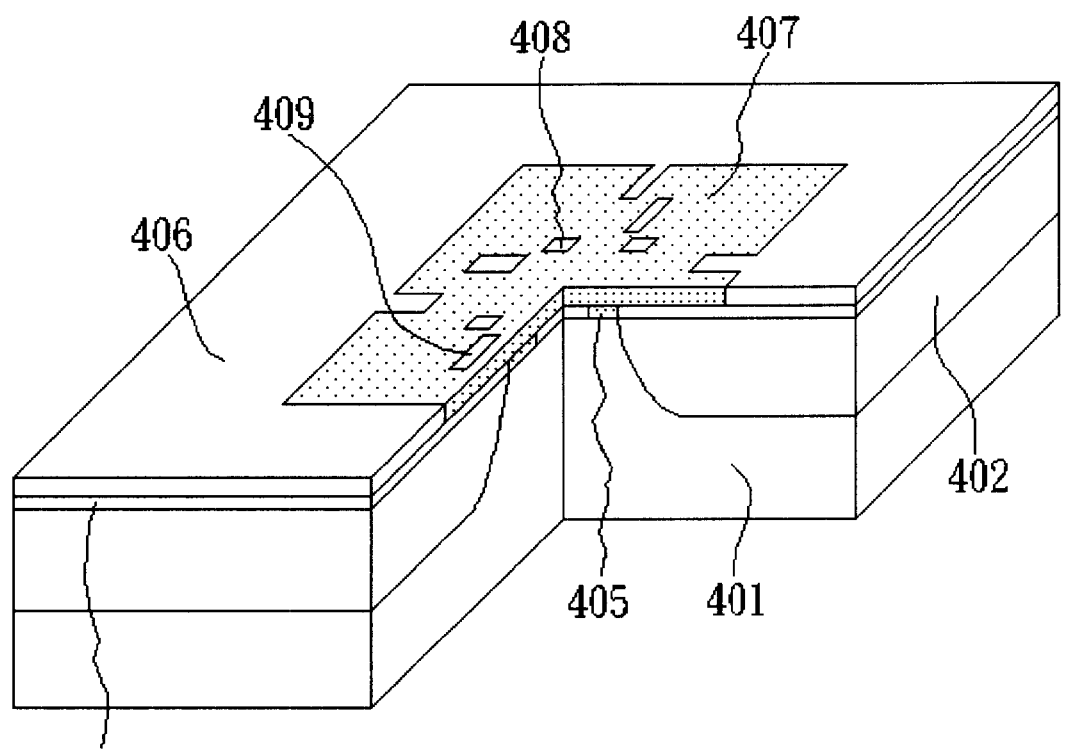

As shown in FIG. 6, after removing the LTO layer by etching in buffered hydrofluoric acid solution, a middle polysilicon layer 406 is deposited on the surface of the bottom polysilicon layer 404 by LPCVD. The thickness of the middle polysilicon layer 406 is mλ/4, where m is an odd number in a general case and 3 in a typical case. Using another formed LTO layer as a mask, a large heavily doped region 407 is formed by phosphorous ion implantation and subsequent thermal annealing. The large heavily doped region 407 covers the underlying small heavily doped regions 405. A plurality of small un-doped regions 408 and 409 are scattered within the large heavily doped region 407. All the small un-doped polysilicon regions 408 and 409 stand on the surface of the underlying un-doped regions of the bottom polysilicon layer 404.

Figure 7:
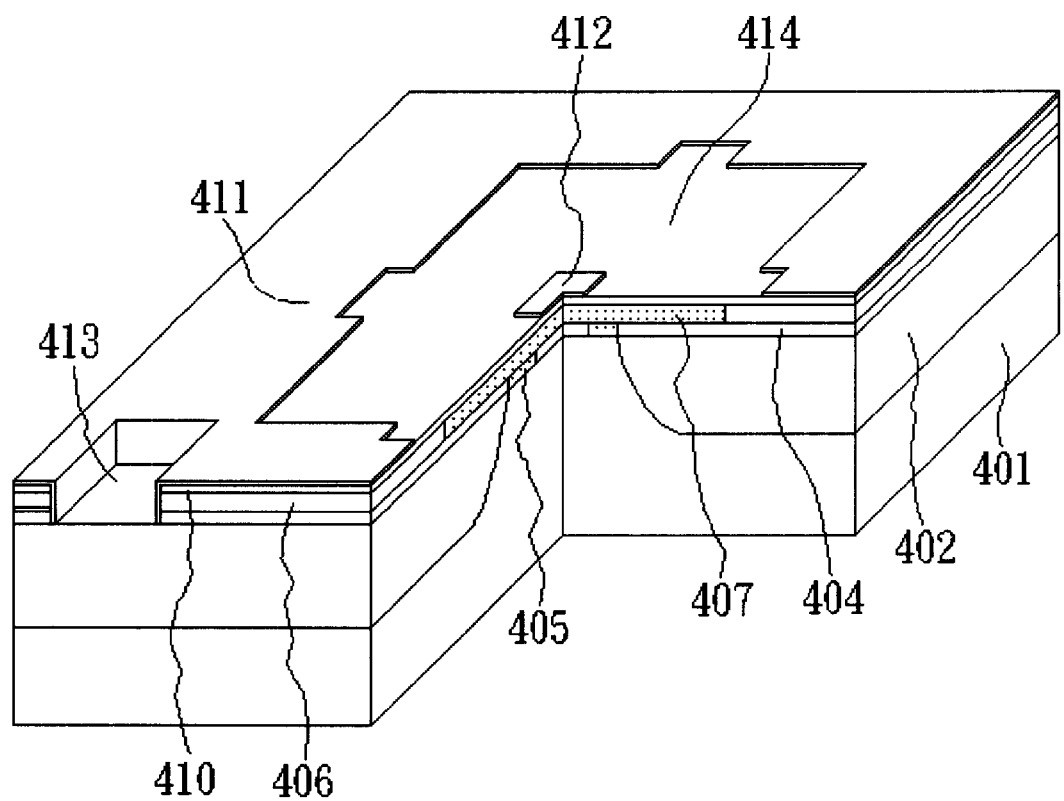

As shown in FIG. 7, following the removal of the LTO layer, a top polysilicon layer 410 is deposited on the surface of the middle polysilicon layer 406 by LPCVD. The thickness of the top polysilicon layer 410 is mλ/4, where m is an odd number in a general case and 1 in a typical case. Soon afterward using photolithography and selective etching a contact hole 413 is created so that it is lowered down to the surface of the underlying n-type diffusion layer. Next a λ/4 thick LTO layer 411 is formed on the surface of the top polysilicon layer 410 by LPCVD. The LTO layer is patterned by photolithography and selective etching to form a large window 414. A 20×20 μm anti-reflection coating pad 412 is a portion of LTO layer 411 at the central area of the window 414 that is not removed when layer 411 is patterned by photolithography and selectively etched.

Figure 8:
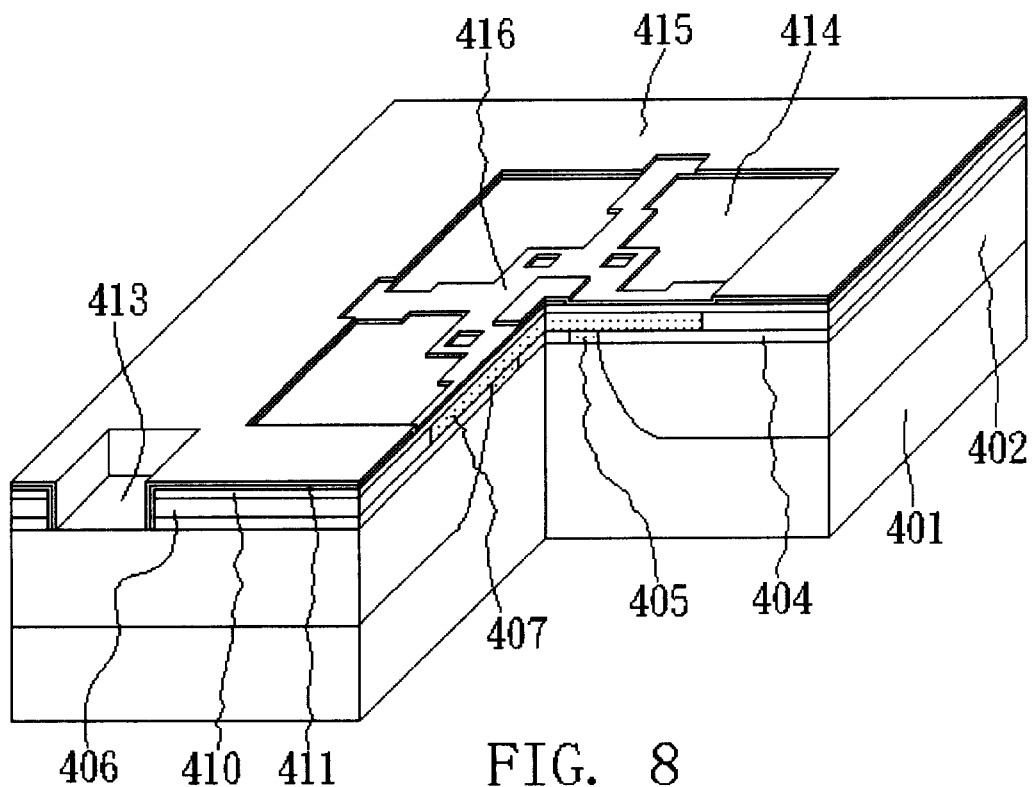

FIG. 8 shows that about 1000 Å thick low stress silicon nitride layer 415 is deposited on the top of the single crystalline silicon substrate 401 by LPCVD. The gases used in LPCVD are dichlorosilane ($SiH_2Cl_2$, DCS) as the source of silicon and $NH_3$ as the source of nitrogen. To achieve low stress levels, the ratio of $NH_3$/DCS is 0.176, the deposition pressure is 150 mTorr, and the deposition temperature is 790° C. The silicon nitride layer 415 is engaged by photolithography and selective etching to form a nitride pattern 416. The nitride pattern 416 includes a 20×20 µm square area at the center that covers the underlying anti-reflection coating pad 412 and four 30×10 µm Z-shaped legs extending outward from the central square area and defining four openings 414 between them.

Figure 9:
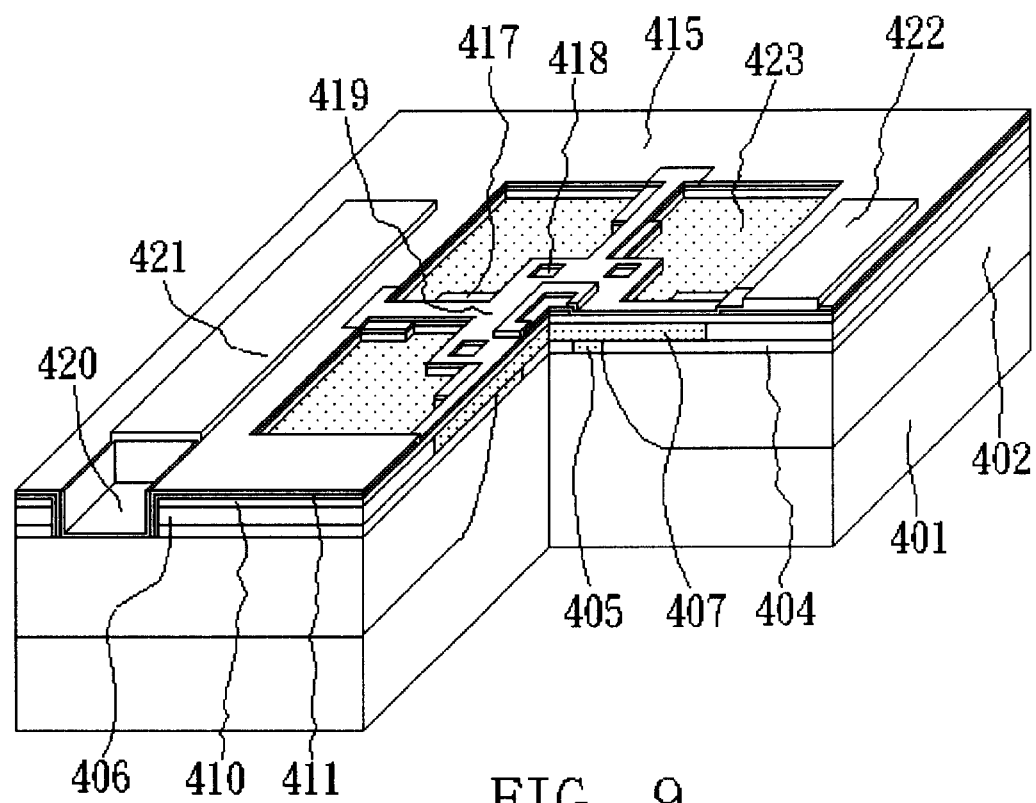

A composite metal layer consisting of about 100 Å thick Cr layer and about 200 Å thick Au layer is deposited on the top of the single crystalline silicon substrate 401 by electron beam evaporation. The composite metal layer is engaged by photolithography and selective etching to form a composite metal pattern. The composite metal pattern includes a 30×30 µm central pad 419 that covers the underlying nitride pattern 416, while leaving out the central area disposed on the surface of the underlying anti-reflection coating pad 412, four small squares 418 disposed on the surface of the underlying small un-doped polysilicon regions 408, and eight small rectangles 417 disposed on the surface of the underlying small un-doped polysilicon regions 409. In addition, the composite metal pattern includes two rectangular pads 421 and 422 disposed on the two opposite sides of the substrate 401, respectively. One pad 421 connects to the electrical contact 420 and the other pad 422 connects to the central pad 419 of the composite metal pattern. Then an electrical plating process is performed to add a thicker gold layer on the top of the pads 421 and 422 that will be used as solder bumps for mounting a photodiode thereon. Next, the polysilicon disposed within the four openings 414 are removed by photolithography and RIE to reveal the underlying heavily doped region 423 of the middle polysilicon layer 406. RIE is performed with gas mixture $Cl_2$+He= 180:400 sccm, chamber pressure 300 mT, RF power 275 W, and substrate temperature 40° C. The resulting etch rate for polysilicon is 5700 Å/min. Since both the composite metal pattern and the nitride pattern can withstand HF etching, they are used as a mask for anodization in HF solution. After these processing steps, the single crystalline silicon substrate 401 is changed as shown in FIG. 9.

The following steps are intended to form porous single crystalline silicon and porous polysilicon that are used as the sacrificial materials for releasing polysilicon membranes and its supporting polysilicon beams.

Porous single crystalline silicon is known to form during, electrochemical dissolution of single crystalline silicon in highly concentrated HF solution. Preferential porous single crystalline silicon formation occurs for different dopant types and different doping concentrations. P+ can be preferentially anodized over p or n, and n+ can be preferentially anodized over p+, p or n. Polysilicon can also be anodized to form porous polysilicon in highly concentrated HF solution and its formation has the same dependence on dopant types and doping concentrations.

A double-tank Teflon cell is used as the anodization cell. This type of the cell consists of two half-cells in which Pt electrodes are immersed and the single crystalline silicon substrate 401 is used to separate and isolate the two half-cells. HF solution is used both for anodization of the polished side and as a back contact. A chemical pump is used to circulate the HF solution. This circulation removes the gas bubbles from the surface of the single crystalline silicon substrate that generate during the anodic reaction and avoids any decrease in the local concentration of electro-active species such as HF.

Since the highly concentrated HF solutions are very strong etchant, a masking layer for protecting the surface of an anodized single crystalline silicon substrate 401 should be reasonably resistant against HF solution. There are several materials can withstand HF solutions. Among them is low stress silicon nitride deposited by LPCVD.

The recipe of the HF solution is chosen to be HF (49 volume %): $C_2H_5OH$ (96 volume %)=1:1. The added Ethanol ($C_2H_5OH$) is used to improve the infiltration of the HF solution in the pores and reduce the size of the gas bubbles attached on the surface of the single crystalline silicon substrate. The anodic current density is kept at about 50 mA/cm$^2$ and the temperature of the HF solution is maintained at room temperature during the anodization process.

Figure 10:
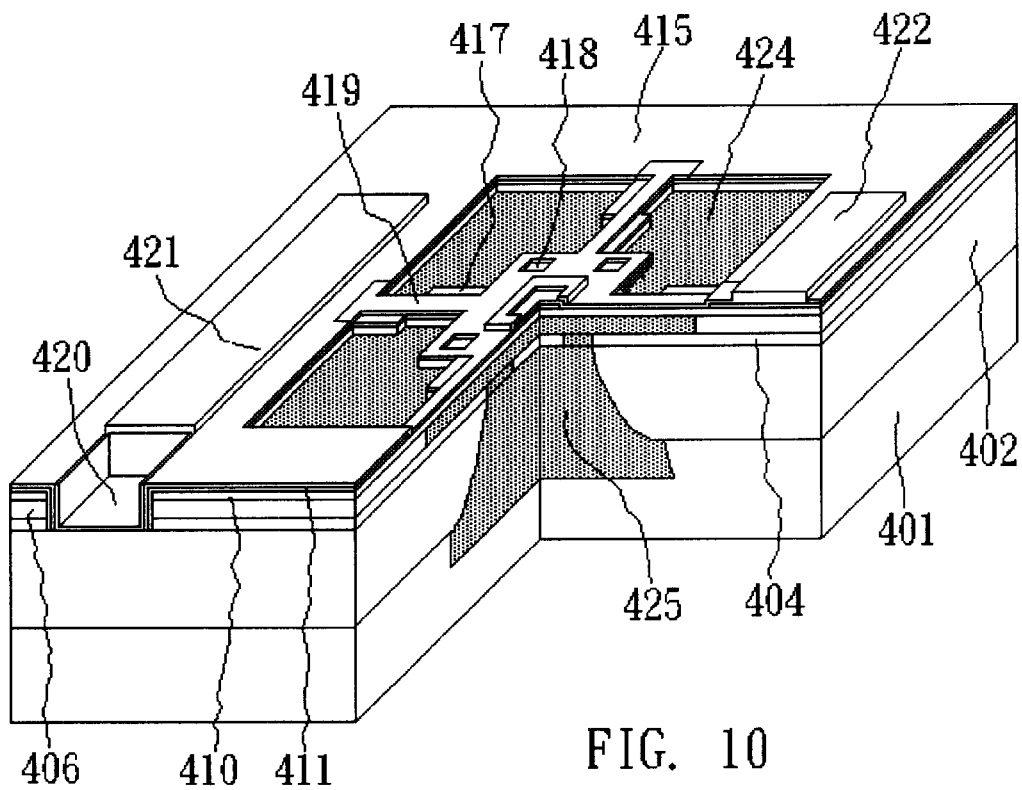

The anodization is first to convert the heavily doped polysilicon disposed in the central region 407 of the middle polysilicon layer 406 and in the four small regions 405 of the bottom polysilicon layer 404 into porous polysilicon 424. Then the anodization is continued to convert the p-type single crystalline silicon disposed in the p-type single crystalline silicon cone 403 surrounded by the n-type diffusion single crystalline silicon layer 402 disposed in the single crystalline silicon substrate 401 into porous single crystalline silicon 425, as shown in FIG. 10. It is noted that the cross section of the porous single crystalline silicon cone 425 has a smooth slanted sidewall and is symmetrically arranged around its central axis.

Figure 11:
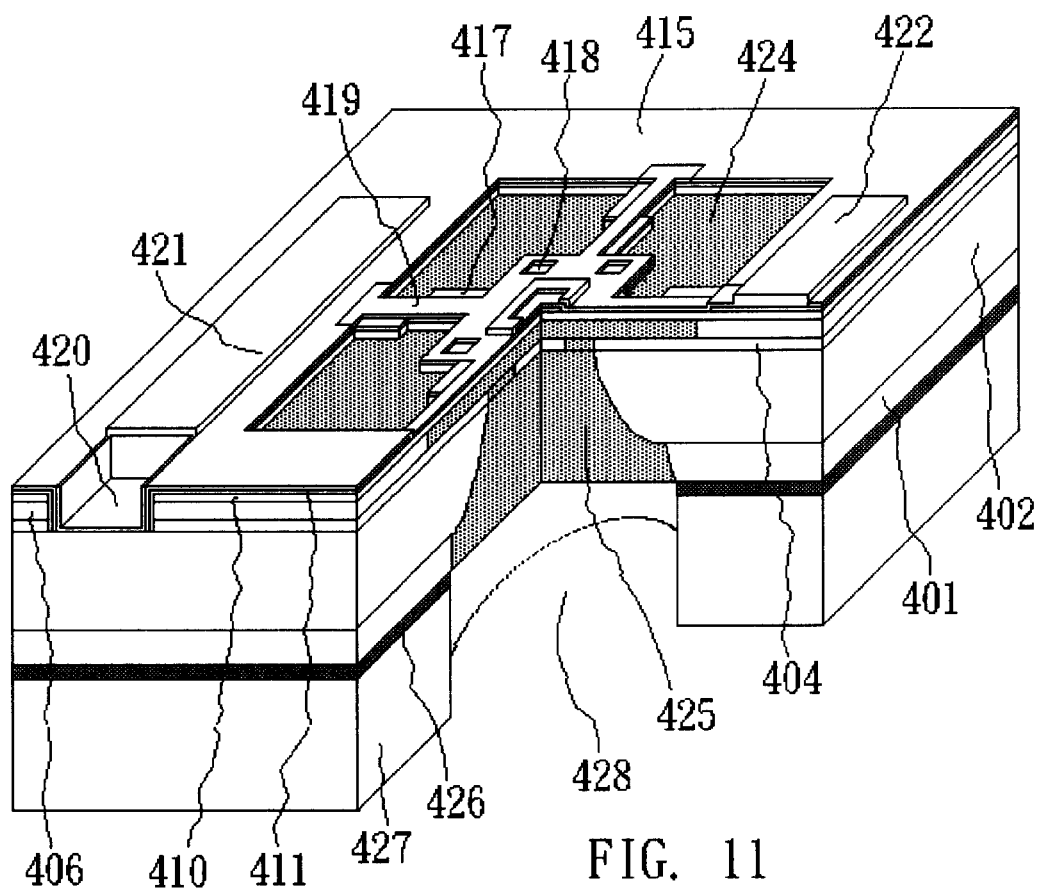

The single crystalline silicon substrate 401 is then cemented onto a rigid plate, such as a glass plate with its front side down by applying an adhesive layer, such as a KPR negative photoresist. Soon afterward the single crystal silicon substrate 401 is thinned to reveal the porous single crystalline silicon cone 425 on its backside using a lapping machine. A perforated metal holding plate or plastic holding plate 427 is then glued to the single crystalline silicon substrate 401 by applying an adhesive layer 426, such as a resin cured at a temperature lower than 120° C. that is a soft-bake temperature for KPR negative photoresist. The throughout hole 428 of the holding plate 427 is aligned with the revealed circle of the porous single crystalline silicon cone 425. After removing the top rigid plate by immersing in a solvent, such as a developer solution, the single crystalline silicon substrate 401 appears as shown in FIG. 11.

Figure 12:
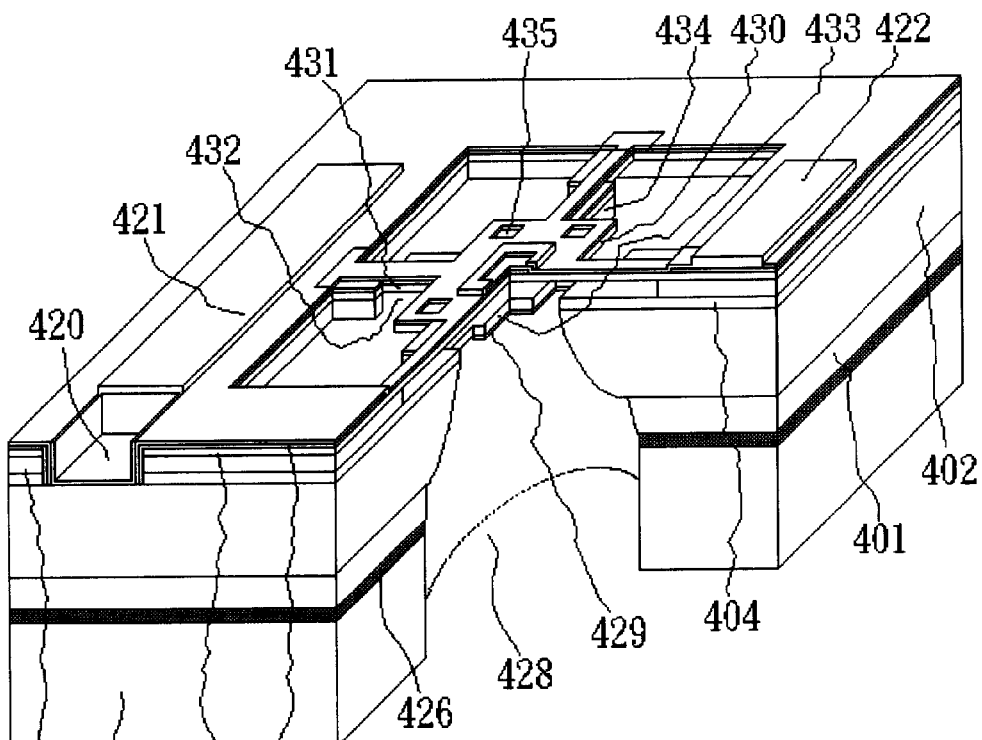

The porous polysilicon 424 and porous single crystalline silicon 425 are removed by etching in a diluted KOH solution, resulting in a top polysilicon membrane 430 and its four supporting polysilicon beams 431, a bottom polysilicon membrane 433, and an air gap 432. It is noted that the top polysilicon membrane 430 is still supported by the four un-doped polysilicon poles 434 that stand on the surface of the underlying un-doped regions of the bottom polysilicon layer 404 and its four supporting polysilicon beams 430 are still supported by the un-doped polysilicon poles 435 that stand on the surface of the underlying un-doped polysilicon regions of the bottom polysilicon layer 404. Then an anti-reflection coating 429 is formed on the back surface of the bottom polysilicon membrane 433 by electron beam evaporation. After these processing steps, the single crystalline silicon substrate 401 appears as shown in FIG. 12.

Figure 13:
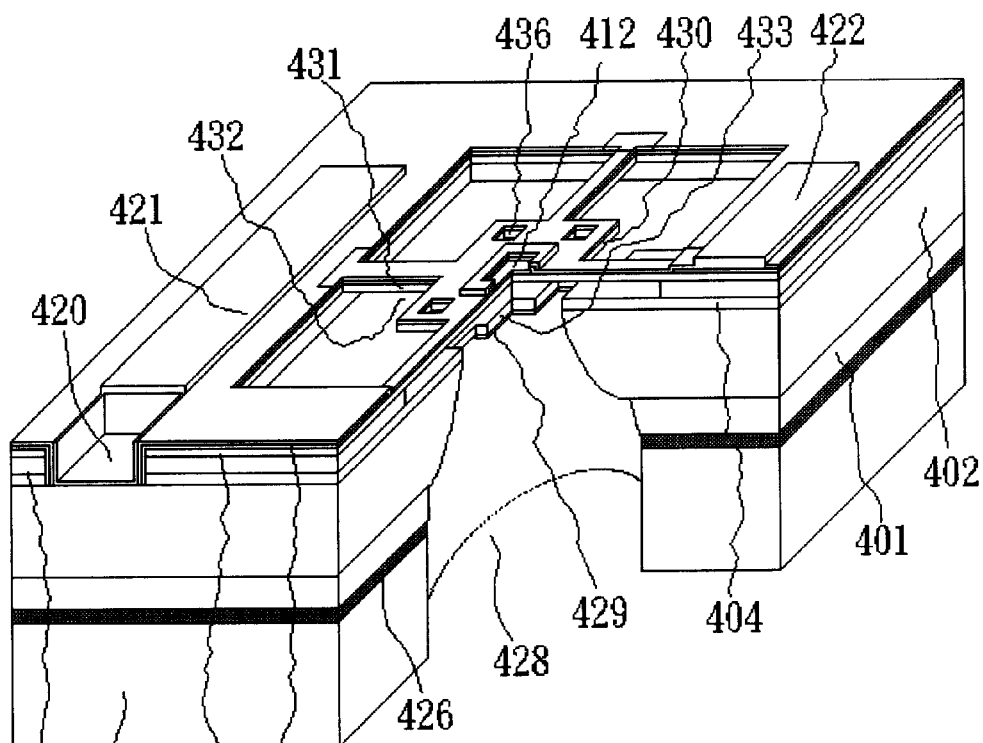

Another RIE process is performed to remove the un-doped polysilicon poles 434 and 435. The etching conditions are $Cl_2$+He=180:400 sccm used for gas mixture, 275 W used for RF power, 300 mTorr used for chamber pressure, 40° C. used for substrate temperature. The resulted etch rates are 5700 Å/min for polysilicon, 530 Å/min for low silicon nitride, and 60 Å/min for LTO. To etch the un-doped polysilicon poles 434 and 435, the RIE etching is carried out to remove the top silicon nitride layer 415, then the top polysilicon layer 410, then the middle polysilicon layer 406, and finally stopped at the bottom polysilicon layer 404. For revealing the anti-reflection coating pad 412, the RIE etching is carried out to remove the top silicon nitride layer 415, then stopped at the LTO layer 412. After the RIE etching the top polysilicon membrane 430 and its supporting polysilicon beams 431, as shown in FIG. 13, are completely released from the bottom polysilicon layer 404. Since the final release of the top polysilicon membrane 430 and its supporting polysilicon beams 431 is done by dry etching, no stiction of the top polysilicon membrane 430 and its supporting polysilicon beams 431 takes place.

Figure 14:
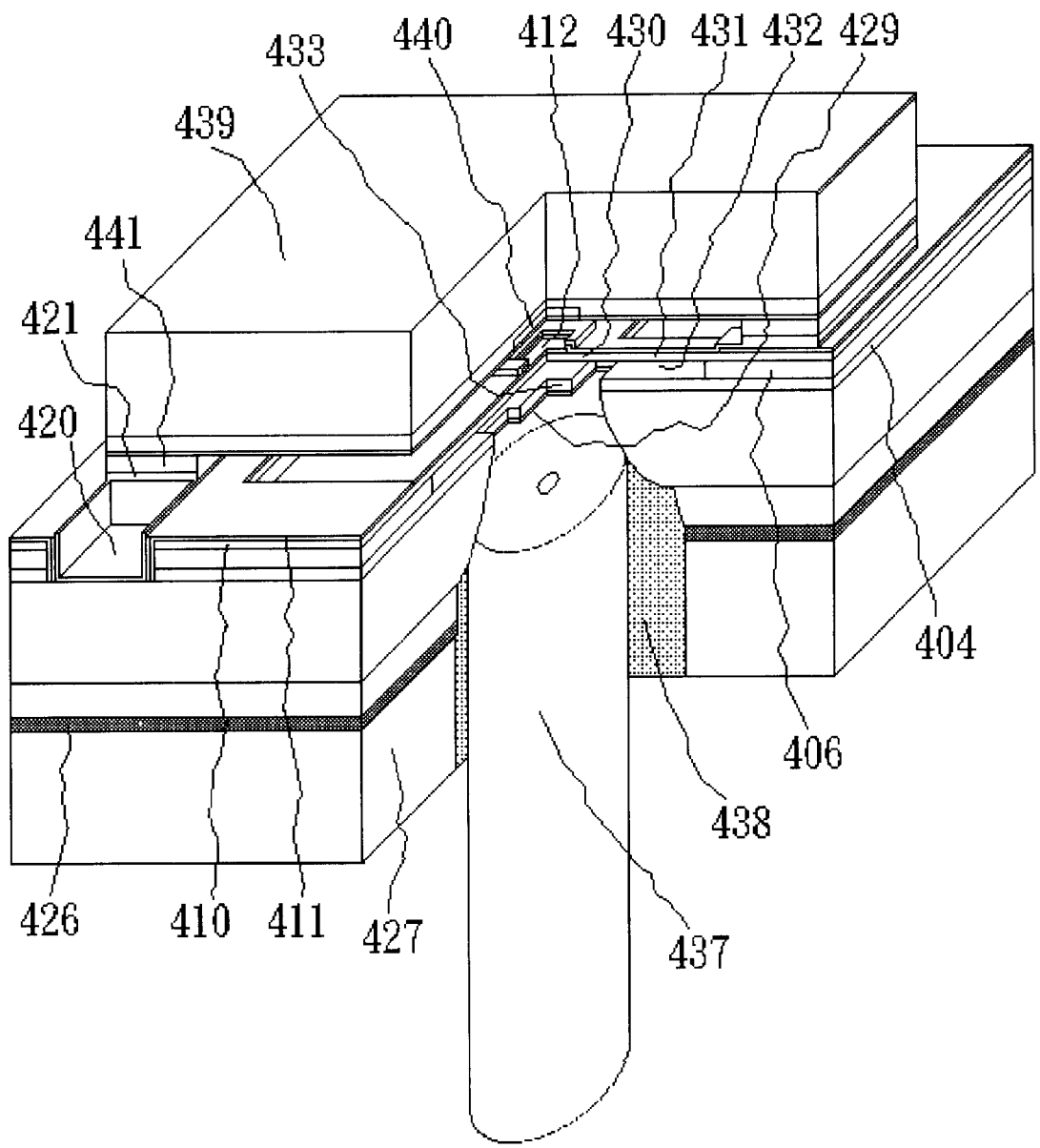

A photodiode 439 is mounted on the top of the single crystalline silicon substrate 401 with its front side down so that its optical sensitive area 440 is aligned with the central axis of the Fabry-Perot cavity consisting of the top polysilicon membrane 430, the bottom polysilicon membrane 433, and the air gap. Two electroplated indium solder bumps 441 are formed on the front side of the photodiode 439 which are connected to the p-type region and n-type region of the photodiode 439, respectively. Then mounting process is performed using a flip-chip assembling machine. During the mounting the solder bumps 441 are aligned with the solder bumps 421 disposed on the surface of the single crystalline silicon substrate 401 and then the photodiode 439 and the single crystalline silicon substrate 401 are pressed together and bonded by cold welding. Thereupon the single crystalline silicon substrate 401 is separated into small dices using a dicing machine Next an optical fiber 437 is inserted into the conic hole of the single crystalline silicon substrate 401 through the throughout hole of the holding plate 427 and fixed to the holding plate 427 by applying epoxy 438. Since the core of the fiber 437 is aligned with the central axis of the Fabry-Perot cavity a light beam coming out from the core of the optical fiber 437 directs to the optical sensitive area 440 of the photodiode 439 precisely. After these processing steps the single crystalline silicon substrate 401 appears as shown in FIG. 14.

An embodiment of the invention described in detail above is intended only to illustrate the invention. Those skilled in the art will recognize from this disclosure that modifications, additions and substitutions can be made in the various features and elements without departing from the true scope and spirit of the invention. The following claims are intended to cover the true scope and spirit of the invention.

What is claimed is:

1. A method for manufacturing a micromachined Fabry-Perot cavity based optical mechanical modulator consisting of a top membrane and its supporting beams, a bottom membrane, a middle supporting frame, a middle air gap, and a conic hole for receiving an optical fiber, comprising the steps of:

forming a p-type silicon cone surrounded by a n-type diffusion silicon layer in a p-type single crystalline silicon substrate;

depositing a bottom un-doped polysilicon layer on the surface of said p-type single crystalline silicon substrate and thereafter forming a plurality of small heavily doped regions in said bottom layer which partially cover said underlying p-type silicon cone;

depositing a middle un-doped polysilicon layer on the surface of said bottom un-doped polysilicon layer, and then doping a portion of the middle un-doped polysilicon layer to create a large central heavily doped region partially covering said underlying small heavily doped regions and a plurality of small un-doped regions that are scattered therein and stand on the surface of said underlying un-doped polysilicon layer;

depositing a top un-doped polysilicon layer on the surface of said middle un-doped polysilicon layer;

creating a plurality of openings in said top un-doped polysilicon layer so as to partially expose said underlying heavily doped region of said middle un-doped polysilicon layer and define an un-released polysilicon membrane and its supporting polysilicon beams from said top un-doped polysilicon layer;

performing anodization in HF solution to turn all said heavily doped polysilicon into porous polysilicon and the p-type silicon of said p-type silicon cone into porous single crystalline silicon;

thinning said single crystalline silicon substrate from its back side to reveal said porous single crystalline silicon;

bonding a rigid plate with a throughout hole onto the back side of said thinned single crystalline silicon substrate so as to align said throughout hole with said revealed porous single crystalline silicon;

removing said porous polysilicon and said porous single crystalline silicon in diluted alkali solution for the partial release of said top polysilicon membrane and its supporting polysilicon beams, for the final release of a bottom polysilicon membrane, and for forming a conic hole in said single crystalline silicon substrate;

depositing an anti-reflective layer on the back surface of said bottom polysilicon membrane and removing the un-doped polysilicon disposed on the top of said a plurality of small un-doped regions of said middle un-doped polysilicon layer and the un-doped polysilicon disposed in said a plurality of small un-doped regions of said middle un-doped polysilicon layer by dry etching for the final release of said polysilicon membrane and its supporting polysilicon beams.

2. The method for manufacturing a micromachined Fabry-Perot cavity based optical mechanical modulator according to claim 1 further comprising a step of forming a hydrofluoric acid (HF)-resistant masking pattern on the surface of said top un-doped polysilicon layer.

3. The method for manufacturing a micromachined Fabry-Perot cavity based optical mechanical modulator according to claim 2 wherein said forming masking pattern includes forming both a silicon nitride layer and silicon dioxide layer on the surface of said polysilicon membrane and its supporting polysilicon beams and forming only a silicon nitride layer on the surface of said un-doped polysilicon regions that stand on the surface of said underlying small un-doped polysilicon regions.

4. The method for manufacturing a micromachined Fabry-Perot cavity based optical mechanical modulator according to claim 1 further comprising a step of forming a hydrofluoric acid (HF)-resistant metallization pattern on the surface of said masking pattern.

5. The method for manufacturing a micromachined Fabry-Perot cavity based optical mechanical modulator according to claim 4 wherein said forming a hydrofluoric acid (HF)-resistant metallization pattern includes forming both a Cr adhesion layer and a Au conduction layer.

6. The method for manufacturing a micromachined Fabry-Perot cavity based optical mechanical modulator according to claim 1 wherein said dry etching is performed using a gas etchant that has a higher etch rate for said silicon nitride and polysilicon, a lower etch rate for silicon dioxide, and almost a zero etch rate for said metallization pattern comprised of Au/Cr.

7. A method for manufacturing a mechanical modulator based and all elements integrated WDM transmitter/receiver module including a Fabry-Perot cavity consisting of a top mirror and its supporting beams, a middle supporting frame, a middle air gap, a bottom mirror, a photodiode mounded above said cavity, and a conic hole for receiving an optical fiber, comprising the steps of:

forming a p-type silicon cone surrounded by a n-type diffusion silicon layer in a p-type single crystalline silicon substrate;

depositing a bottom un-doped polysilicon layer on the surface of said p-type single crystalline silicon substrate and thereafter forming a plurality of small heavily doped polysilicon regions in said bottom layer which partially cover said underlying p-type silicon cone;

depositing a middle un-doped polysilicon layer on the surface of said bottom un-doped polysilicon layer, and then doping a portion of the middle un-doped polysilicon layer to create a large central heavily doped region partially covering said underlying small heavily doped polysilicon regions and having a plurality of small un-doped polysilicon regions that are scattered therein and stand on the surface of said underlying un-doped polysilicon layer;

depositing a top un-doped polysilicon layer of the surface of said middle un-doped polysilicon layer;

creating a plurality of openings in said top un-doped polysilicon layer so as to partially expose said underlying heavily doped region of said middle un-doped polysilicon layer and define an un-released polysilicon membrane and its supporting polysilicon beams from said top un-doped polysilicon layer;

performing anodization in HF solution to turn all said heavily doped polysilicon into porous polysilicon and the p-type silicon of said p-type silicon cone into porous single crystalline silicon;

thinning said single crystalline silicon substrate from its back side to reveal said porous single crystalline silicon;

bonding a rigid plate with a throughout hole onto the back side of said thinned single crystalline silicon substrate so as to align said throughout hole with said revealed porous single crystalline silicon;

removing said porous polysilicon and said porous single crystalline silicon in diluted alkali solution for the partial release of said top polysilicon membrane and its supporting polysilicon beams, for the final release of a bottom polysilicon membrane, and for forming a conic hole in said single crystalline silicon substrate;

depositing an anti-reflective layer on the back surface of said bottom polysilicon membrane;

removing the un-doped polysilicon on the top of said a plurality of small un-doped regions of said middle un-doped polysilicon layer and the un-doped polysilicon of said a plurality of small un-doped regions of said middle un-doped polysilicon layer polysilicon by dry etching for the final release of said polysilicon membrane and its supporting polysilicon beams;

mounting a photodiode on the top of said single crystalline silicon substrate and inserting an optical fiber into said conic hole of said single crystalline silicon substrate through said throughout hole of said rigid plate.

8. The method for manufacturing a mechanical modulator based and all elements integrated WDM transmitter/receiver module according to claim 7 further comprising a step of forming a hydrofluoric acid (HF)-resistant masking composite pattern on the surface of said top un-doped polysilicon layer.

9. The method for manufacturing a mechanical modulator based and all elements integrated WDM transmitter/receiver module according to claim 8 wherein said forming masking includes forming both a silicon nitride layer and silicon dioxide layer on the surface of said polysilicon membrane and its supporting polysilicon beams and forming only a silicon nitride layer on the surface of said un-doped polysilicon regions that stand on the surface of said underlying small un-doped polysilicon regions.

10. The method for manufacturing a mechanical modulator based and all elements integrated WDM transmitter/receiver module according to claim 7 further comprising a step of forming a hydrofluoric acid (HF)-resistant metallization pattern on the surface of said masking pattern.

11. The method for manufacturing a mechanical modulator based and all elements integrated WDM transmitter/receiver module according to claim 10 wherein said forming a hydrofluoric acid (HF)-resistant metallization pattern includes forming both a Cr adhesion layer and a Au conduction layer.

12. The method for manufacturing a mechanical modulator based and all elements integrated WDM transmitter/receiver module according to claim 7 wherein said dry etching is performed using a gas etchant that has a higher etch rate for said silicon nitride and polysilicon, a lower etch rate for silicon dioxide, and almost a zero etch rate for said metallization pattern comprised of Au/Cr.

* * * * *